US006423908B1

(12) United States Patent
Liu

(10) Patent No.: US 6,423,908 B1
(45) Date of Patent: Jul. 23, 2002

(54) SUBSTRATE FOR USE IN FORMING ELECTRONIC PACKAGE

(75) Inventor: Sheng Tsung Liu, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/706,749

(22) Filed: Nov. 7, 2000

(51) Int. Cl.$^7$ .......................... H01R 12/04; H05K 1/11
(52) U.S. Cl. ...................................... 174/261; 361/767
(58) Field of Search ..................... 174/261; 257/797; 361/802, 767–772, 774, 777–779, 808; 24/833

(56) References Cited

U.S. PATENT DOCUMENTS

| | | | | |
|---|---|---|---|---|
| 4,600,970 A | * | 7/1986 | Bauer | 361/403 |
| 5,381,307 A | * | 1/1995 | Hertz et al. | 361/767 |
| 5,426,266 A | * | 6/1995 | Brown et al. | 174/267 |
| 5,641,946 A | * | 6/1997 | Shim | 174/261 |
| 6,201,193 B1 | * | 3/2001 | Hashimoto | 174/260 |
| 6,225,573 B1 | * | 5/2001 | Nakamura | 174/267 |
| 6,265,119 B1 | * | 7/2001 | Magome | 430/30 |

* cited by examiner

Primary Examiner—Kamand Cuneo
Assistant Examiner—Jeremy Norris

(57) ABSTRACT

A substrate for use in forming an electronic package. The substrate is characterized by having adapted mark directly formed within bonding pads or a metal paddle. The bonding pads are adapted for receiving a surface-mountable device. The metal paddle is adapted for receiving a semiconductor chip. The "mark" may be a text mark or a graphical mark. The mark is directly formed within the bonding pads or the metal paddle, thereby creating substantially no reliability problems.

7 Claims, 2 Drawing Sheets

SUBSTRATE FOR USE IN FORMING ELECTRONIC PACKAGE

BACKGROUND OF THE INVENTION

1. Field of the Invention

This invention relates to a substrate for use in forming an electronic package.

2. Description of the Related Art

An electronic package typically includes a circuitized substrate with one or more active devices attached thereon; packages including only one device are known as Single Chip Modules (SCM), while packages including a plurality of devices are called Multi Chip Modules (MCM). The active device is typically a chip, a small piece of a wafer commonly made of Silicon, Germanium or Gallium Arsenide. Normally, the chip is protected in a package body formed from encapsulant.

As the speed of electronic packages increase, noise in the DC power and ground lines increasingly becomes a problem. To reduce this noise, passive components such as decoupling capacitors are often used to reduce power supply noise which occurs due to change in potential difference between the ground voltage and the power-supply voltage supplied to the active device. The decoupling capacitors are placed as close to the active device as practical to increase their effectiveness. Typically, the decoupling capacitors are directly integrated with the substrate.

Normally, the decoupling capacitors are surface-mountable devices (SMD's) used in the so-called surface-mounting technique (SMT) in which the capacitors are directly secured to the substrate via two end contacts thereof. As the degree of integration become higher, bonding pads on the substrate for receiving passive components need to be marked according to the requirements of manufacturing process so as to provide grounds for preparing the material list and SOP (standard operation procedure).

In the field of SMT applications, areas on the substrate around the bonding pads 100 are usually printed with ink (such as white ink) to form text marks such as "C1 • C3 • R2 • R4 • L6" pictured in FIG. 1 for serving as indications during the SMT process wherein "C", "R" and "L" stand for "capacitor", "resistor", and "inductance", respectively, and the attached number indicate the mounting order of each component. Furthermore, the conventional BGA substrate usually has a text mark (such as "U1" pictured in FIG. 2) and an irregular mark 110 (see FIG. 2) provided on the backside surface thereof. The irregular mark 110 will be located by a recognition system to indicate the position of pin 1.

However, in the field of semiconductor packaging, using marks formed by ink could lead to serious reliability problems because the bond between ink and substrate as well as the bond between ink and package body are both quite weak. Because of the coefficient of thermal expansion (CTE) mismatch, stress is created at the interface between the text mark and the substrate or package body as conventional packages experience temperature changes. The stress, in turn, results in the delamination of the ink-substrate or ink-encapsulant interface. After the ink-substrate or ink-encapsulant interface becomes delaminated, moisture from the environment diffuses through the plastic package body to the delaminated area. Once moisture accumulates in the package, rapid temperature increases will cause the moisture to vaporize and expand, thereby creating an internal pressure in the delaminated area which causes the surrounding plastic package body to crack. Besides, the ink marking may be scratched and become faint during shipping such that the contour of the ink marking changes too much to be identified.

Therefore, the present invention seeks to provide a substrate for use in forming an electronic package which overcomes, or at least reduces the above-mentioned problems of the prior art.

SUMMARY OF THE INVENTION

It is a primary object of the present invention to provide a substrate for use in forming an electronic package wherein the substrate is characterized by having a mark directly formed within bonding pads for indicating the type of to-be-mounted SMT.

It is another object of the present invention to provide a substrate for use in forming an electronic package having a metal paddle adapted for receiving a semiconductor chip wherein the substrate is characterized by having a mark directly formed within the metal paddle for indicating the position of pin 1.

The substrate in accordance with a preferred embodiment of the present invention comprising at least a pair of bonding pads adapted for receiving a surface-mountable device. The substrate is characterized in that the at least a pair of bonding pads has a mark formed therein.

The substrate in accordance with another preferred embodiment of the present invention comprising a metal paddle adapted for receiving a semiconductor chip. The substrate is characterized in that the metal paddle has at least a mark formed therein.

The "mark" of the present invention may be a text mark or a graphical mark. The mark is preferably formed by etching. Since the mark is directly formed within the bonding pads or the metal paddle, thereby creating substantially no additional reliability problems.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
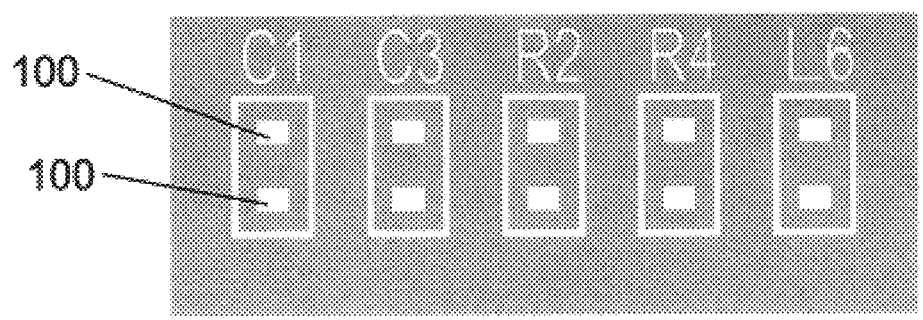
FIG. 1 is a top plan view of a portion of a typical substrate for use in forming an electronic package illustrating text mark printed with ink nearby the bonding pads.
Figure 2:
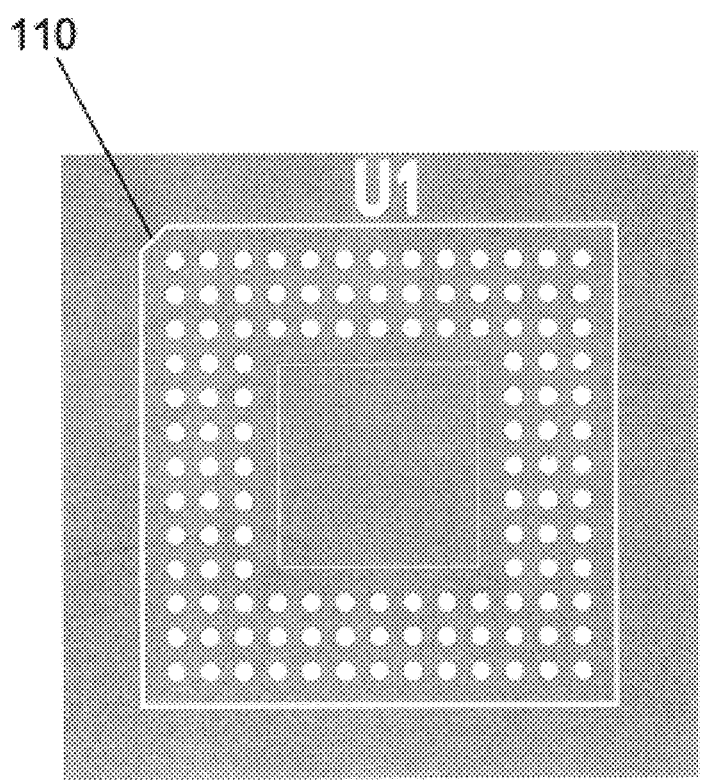
FIG. 2 is a bottom plan view of a typical BGA substrate.
Figure 3:
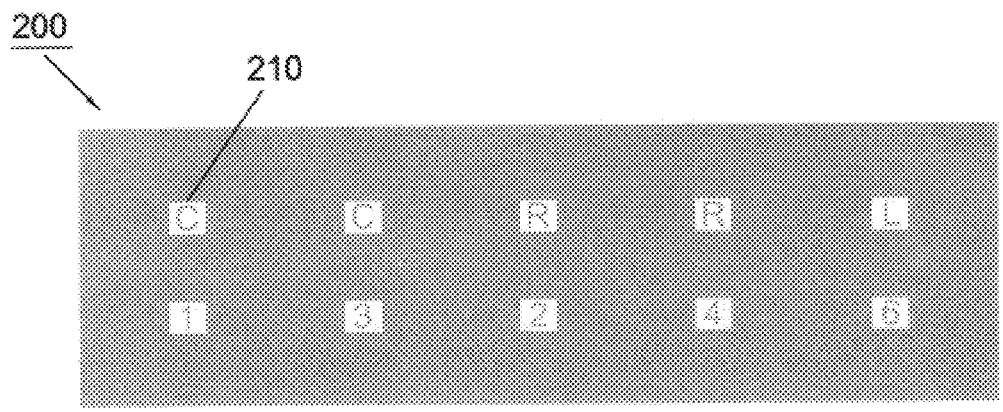
FIG. 3 is a top plan view of a portion of a substrate for use in forming an electronic pakage according to a first preferred embodiment of the present invention illustrating text marks directly formed within the boding pads.

FIG. 3 shows a portion of a substrate 200 according to a first preferred embodiment of the present invention. The substrate 200 comprises five pairs of bonding pads 210, each pair adapted for receiving a surface-mountable device. In the present invention, the surface-mountable device is preferably a passive component. It could be understood that the passive components may include capacitors, resistors and inductors arranged as filters to suppress power source noises and attain speed-up of the operation of the chip. Typically, the surface-mountable device is secured to each pair of bonding pads 210 through two end contacts thereof by surface-mounting technique (SMT).

The substrate 200 is characterized in that each pair of bonding pads 210 has a text mark such as "C1 • C3 • R2 • R4 •L6" pictured in FIG. 3 formed therein for serving as indications during the SMT process wherein "C", "R" and "L" stand for "capacitor", "resistor", and "inductance", respectively, and the attached number indicate the mounting order of each component.

Figure 4:
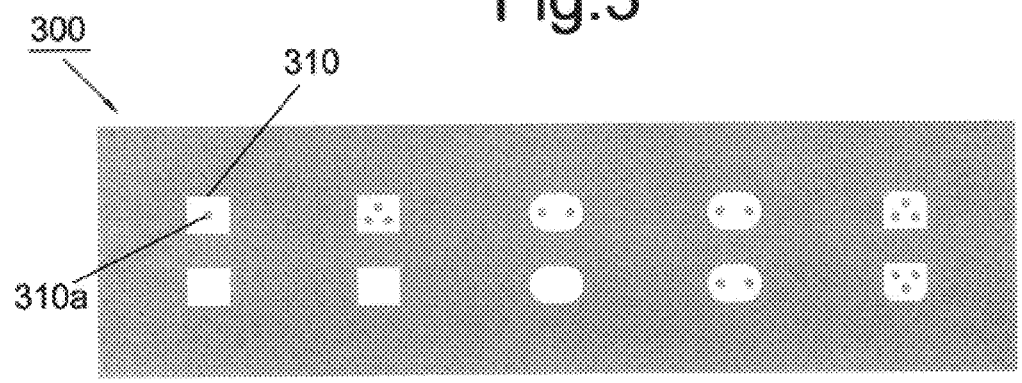
FIG. 4 is a top plan view of a portion of a substrate for use in forming an electronic package according to a second preferred embodiment of the present invention illustrating graphical marks directly formed within the boding pads.

FIG. 4 shows a portion of a substrate 300 according to a second preferred embodiment of the present invention. The substrate 300 comprises five pairs of bonding pads 310, each pair adapted for receiving a surface-mountable device. The substrate 300 is characterized in that each pair of bonding pads 210 has a graphical mark (such as hole 310a in FIG. 4) formed therein, wherein the number of holes 310a in each pair of binding pads 310 indicate the mounting order of each component. It could be understood that each pair of bonding pads 310 is preferably designed with different contour according to what kind of the surface mountable device is to be mounted. For example, in the FIG. 3, bonding pads in the shape of square are designed to be mounted. For example, in the FIG. 3, bonding pads are to be mounted with a resistor, and bonding pads in the shape of irregular polygon are to be mounted with a inductance.

Figure 5:
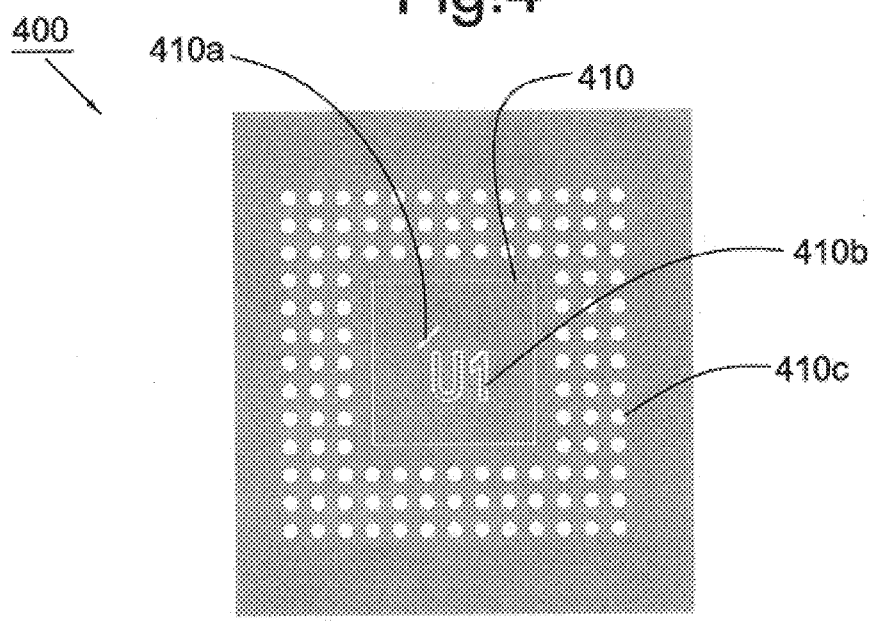
FIG. 5 is a bottom plan view of a BGA substrate according to a third preferred embodiment of the present invention illustrating a text mark and a graphical mark directly formed within the metal paddle.

FIG. 5 shows, in a bottom view, a BGA substrate 400 according to a fourth preferred embodiment of the present invention. The substrate 400 mainly comprises a metal paddle 410 adapted for receiving a semiconductor chip (not shown). The substrate 400 is characterized in that the metal paddle has a text mark such as "UI" pictured in FIG. 5 and a graphical mark such as an irregular mark 410a pictured in FIG. 5. The irregular mark 410a is adapted to be identified by a recognition system for indicating the position of pin 1, and then the recognition system can provide all the coordinates of the ball pads 410c needed in the following testing or trouble-shooting process.

Conventional process for use in making a substrate comprises the steps of:

(a) laminating a conductive metal layer such as a copper foil with a roughed surface on both sides of a dielectric layer (suitable dielectric material such as fiberglass reinforced BT (bismaleimide-triazine) resin or FR-4 fiberglass reinforced epoxy resin) by conventional methods such as thermocompression; (b) forming vias and through-holes in the product of step (a) by any of a number of well-known techniques such as mechanical drilling or laser drilling, and then electroless plating the vias and through-holes with a layer of electrically conductive metal such as copper; (c) forming a photoresist layer over the surface of the conductive metal layers laminated on the dielectric layer using conventional techniques and materials, then imaged and developed (As is well-known, a photomask is used to image only certain area of the photoresist layer which, when developed, are removed to leave predetermined portions of the conductive metal layers exposed); (d) etching the exposed portions of the conductive metal layers so as to form desired conductive traces or conductive regions, e.g., the ball pads, the bonding pads, and the metal paddle; (e) forming a photoimagable solder mask over the patterned surfaces of the substrate, transferred a predetermined pattern, and then developed; and (e) plating a material which allows a good bond to be formed with conventional material of bonding wires such as gold or palladium on areas of the patterned conductive metal layer without covering by the solder mask. The marks of the present invention can be formed using the conventional process described above without introducing any additional step. That is accomplished by transferring a predetermined pattern having the design of desired text mark or graphical mark integrated therein during step (c).

Typically, in production, it is desirable to integrally form a plurality of substrates in a strip (typically referred to as a "substrate strip") having alignment holes so that the packaging process can be automated.

Since the mark of the present invention is directly formed within the bonding pads or the metal paddle by etching, thereby creating substantially no additional reliability problems. Besides, the etched bonding pads or metal paddle can withstand abrasion during shipping such that the contour of the mark will remain intact for identification.

although the invention has been explained in relation to its preferred embodiment, it is to be understood that many other possible modifications and variations can be made without departing from the spirit and scope of the invention as hereinafter claimed.

What is claimed is:

1. A substrate for use in forming an electronic package, the substrate comprising at least a pair of bonding pads adapted for receiving a surface-mountable device, wherein at least one of the bonding pads has a mark formed therein and the substrate is one of a plurality of substrates formed in a strip configuration for use in forming a plurality of substrate-based packages.

2. A substrate for use in forming an electronic package, the substrate comprising a metal paddle adapted for receiving a semiconductor chip, wherein the metal paddle has at least a mark formed therein and the substrate is one of a plurality of substrates formed in a strip configuration for use in forming a plurality of substrate-based packages.

3. A substrate for use in forming an electronic package, the substrate comprising at least a pair of bonding pads adapted for receiving a surface-mountable device, wherein at least one of the bonding pads has a text mark formed therein for serving as an indication.

4. The substrate as claimed in claim 3, wherein the text mark comprises at least one letter of the alphabet.

5. The substrate as claimed in claim 3, wherein the bonding pads have different said text marks formed therein for indicating an order in which corresponding leads of the surface-mountable device should be mounted on the bonding pads of the substrate.

6. A substrate for use in forming an electronic package, the substrate comprising at least two sets of bonding pads, each set being adapted for receiving a surface-mountable device, wherein the bonding pads of one of said sets have a shape different from that of the bonding pads of the other set, wherein at least one of the bonding pads has a graphical mark formed therein.

7. A substrate for use in forming an electronic package, the substrate comprising at least two sets of bonding pads, each set being adapted for receiving a surface-mountable device, wherein the bonding pads of one of said sets have a shape different from that of the bonding pads of the other set, wherein each of the bonding pads in at least one of said sets has a mark formed therein, which is unique for said bonding pad, said marks of the bonding pads in said at least one set indicating an order in which corresponding leads of the corresponding surface-mountable device should be mounted on the substrated.

* * * * *